United States Patent [19]

Manocha et al.

[11] Patent Number: 5,328,872
[45] Date of Patent: Jul. 12, 1994

[54] METHOD OF INTEGRATED CIRCUIT MANUFACTURING USING DEPOSITED OXIDE

[75] Inventors: Ajit S. Manocha, Allentown, Pa.; Virendra V. S. Rana, South Whitehall Township, Lehigh County; James F. Roberts; Ankineedu Velaga, both of Allentown, all of Pa.

[73] Assignee: AT&T Bell Laboratories, Murray Hill, N.J.

[21] Appl. No.: 459,167

[22] Filed: Dec. 29, 1989

[51] Int. Cl.⁵ .......................................... H01L 21/02
[52] U.S. Cl. .................................. 437/235; 437/236; 427/255.1; 427/255.2
[58] Field of Search .................. 437/235, 236; 427/255.1, 255.2

[56] References Cited

U.S. PATENT DOCUMENTS

| | | | |
|---|---|---|---|
| 4,557,950 | 12/1985 | Foster et al. | 437/236 |
| 4,781,945 | 11/1988 | Nishimura et al. | 437/235 |
| 4,791,005 | 12/1988 | Becker et al. | 437/236 |
| 4,849,259 | 7/1989 | Biro et al. | 427/255.2 |
| 4,876,225 | 10/1989 | Wagner et al. | 437/248 |
| 4,894,352 | 1/1990 | Lane et al. | 437/235 |

OTHER PUBLICATIONS

*Journal of Vacuum Science and Technology,* "Process and Film Characterization of Low-Pressure Tetraethylothosilicate-Borophosphosilicate Glass," B4, pp. 732-744, May/Jun. 1986; F. S. Becker et al.

*NEC Research and Development,* "Ozone/Organic'-Source APCVD for ULSI Reflow Glass Films," 94, pp. 1-7, Jul. 1989, Yasuo Ikeda et al.

*Primary Examiner*—Brian E. Hearn
*Assistant Examiner*—Trung Dang
*Attorney, Agent, or Firm*—Richard D. Laumann

[57] ABSTRACT

Contamination of LPCVDBP TEOS films is reduced by preventing volatile compounds, resulting from reactions of the residue in the outlet of the furnace from reaching the deposition portion of the furnace where they would otherwise react with the deposition gases to produce chemically generated particles which contaminate the dielectric film.

1 Claim, 1 Drawing Sheet

METHOD OF INTEGRATED CIRCUIT MANUFACTURING USING DEPOSITED OXIDE

TECHNICAL FIELD

This invention relates to a method of integrated circuit manufacture using chemical vapor deposition of a dielectric.

BACKGROUND OF THE INVENTION

As integrated circuit features continue to decrease in size and the number of components of an integrated circuit continues to increase, the requirements imposed upon the dielectrics commonly used in integrated circuit manufacture become more stringent. A dielectric is commonly deposited on the surface of a wafer and patterned to selectively expose portions of the surface. A metal or other conductive material, deposited on the surface of the dielectric, provides contacts to and between the individual devices. The surface of the dielectric must be reasonably planar so that the metal, typically aluminum, can be deposited without any electrical discontinuities. Such metal deposition becomes more difficult to perform as horizontal distances between devices decrease and the as deposited dielectric has a non-planar surface. Methods have been sought which planarize the dielectric surface. A typical method of planarizing a dielectric surface heats the dielectric and causes it to flow. However, the maximum temperature to which a circuit can be heated is lowered as, e.g., movement of dopants in the semiconductor must be restricted as junctions become shallower. The dielectric is typically $SiO_2$ to which minor amounts of dopants, such as boron and phosphorus, are added to reduce the temperature at which the glass flows. Phosphorus also getters sodium and prevents its diffusion into junctions.

Several techniques, including chemical vapor deposition, have been used for dielectric deposition. One commonly used technique oxidizes, with oxygen, hydrides such as $SiH_4$, $B_2H_6$ (diborane) and $PH_3$ (phosphine). This dielectric is typically referred to as BPSG (borophosphosilicate glass). Another technique decomposes an organo-silicon compound, such as tetraethylorthosilicate which is commonly referred to as TEOS. Other compounds, e.g., phosphine and trimethyl borate, are typically present as dopant sources. See, for example, *Journal of Vacuum Science and Technology*, B4, pp. 732-744, May/June 1986. This paper reports the low pressure deposition of borophosphosilicate glass using TEOS. The authors reported particle densities that were less than 0.2 per $cm^2$. Later reports deal with the atmospheric pressure deposition of the dielectric. See, for example, *NEC Research and Development*, 94, pp. 1-7, July, 1989. The authors, who used ozone rather than oxygen, reported no measurable amounts of any unwanted impurities in the dielectric although surface particle concentrations were not reported.

We have found that TEOS films deposited at low pressure are preferable to those deposited at atmospheric pressure because they are smoother and have lower particulate counts. Also, TEOS films with both boron and phosphorus present in minor amounts, commonly referred to as BPTEOS, are preferred to BPSG films because they have better step coverage and a reduced tendency to flake off reactor surfaces. However, we have found that BPTEOS films have an unwanted tendency to accumulate particles during deposition.

SUMMARY OF THE INVENTION

A method of integrated circuit manufacture comprising the low pressure chemical vapor depositing of BPTEOS and further comprising the step of preventing unwanted deposition of chemically generated particles on or in the BPTEOS film. The unwanted deposition of chemically generated particles is prevented by reducing the extent of the chemical reaction by reducing the concentration of harmful volatile compounds in the furnace. In preferred embodiments, this is done by eliminating the back flow of volatile compounds into the furnace when the furnace is opened to the atmosphere, reacting unwanted compounds and exhausting the product; or by using a load locked chamber when wafers are loaded into or removed from the furnace. The load locked chamber prevents water vapor from entering the furnace. The depositing is desirably at low pressure.

BRIEF DESCRIPTION OF THE DRAWING

The FIGURE is a schematic representation of apparatus suitable for the practice of this invention. For reasons of clarity, the elements depicted are not drawn to scale.

DETAILED DESCRIPTION

Figure 1:
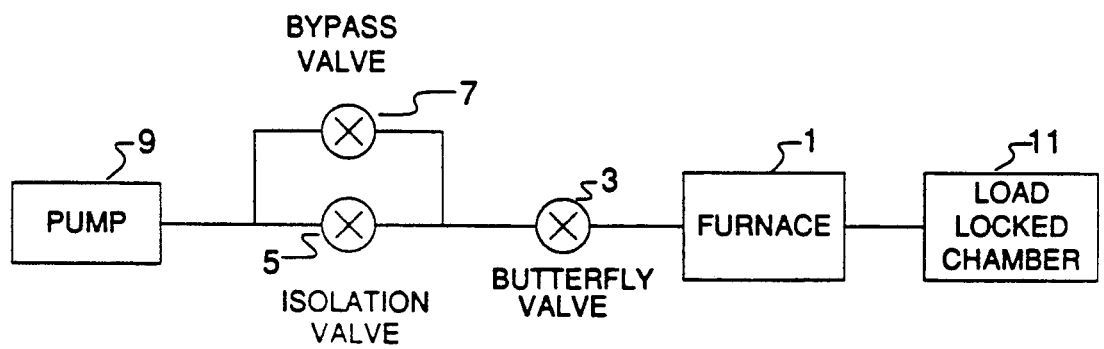

We have found that during the deposition of BPTEOS films a residue condenses in the exhaust portion of the reaction vessel or furnace. This residue or condensate can cause particulate contamination of the BPTEOS films during the next deposition run. We believe that atmospheric moisture reacts with the condensate to create volatile compounds when the furnace is opened, e.g., to load or unload a batch of wafers. We hypothesize that the back diffusion of these compounds into the deposition portion of the furnace before or during the deposition run causes the unwanted contamination of the BPTEOS films due to a reaction of the volatile compound with one of the precursor gases, such as $PH_3$, leading to chemically generated particles on the dielectric. The unwanted contamination can be reduced by preventing the back flow of the volatile compound into the deposition portion of the furnace by forming and exhausting the volatile compound, or by preventing the volatile compound formation.

Apparatus suitable for the practice of this invention is schematically depicted in the FIGURE. The FIGURE shows furnace 1, butterfly valve 3, isolation valve 5, bypass valve 7 and vacuum pump 9. Also depicted is load locked chamber 11 which is connected to furnace 1. Furnace 1 is typically a reactor in which gases react at a high temperature to create a deposition reaction. The butterfly valve is connected to the furnace and functions as a throttle valve. The isolation and bypass valves are connected in parallel with each other and are also connected to both the butterfly valve and to the pump 9. The bypass valve, or a separate series valve, controls the magnitude of the flow. The load locked chamber 11 is also connected to a vacuum system (not depicted). The load locked chamber, as well as the bypass valve, are absent in prior art apparatus. The gas sources, and other components, are well known to those skilled in the art and are not depicted. The precursors are TEOS, a boron source such as trimethylborate (TMB), and a phosphorus source such as $PH_3$ or trimethyl phosphite or other organophosphorous compound. Deposition is typically at low pressure, i.e., 10 torr or less. Those skilled in the art will readily understand how to assemble and operate the apparatus depicted.

During typical prior art operation, the furnace is isolated from the vacuum pump at the end of a deposition run by closing the isolation valve. The furnace is then filled with inert gas, to atmospheric pressure, and opened. The wafers in the furnace are removed and a new batch of wafers is inserted, etc.

In a preferred embodiment, we leave the bypass valve open during the time that the wafers are removed from and inserted into the furnace. This procedure permits the vacuum pump to pump on the furnace albeit at a low rate. However, even this low rate removes the unwanted volatile compounds which result from the reaction of at least one component of air with the condensate and also reduces the unwanted backflow of the volatile compounds into the furnace because the flow of gas is from the furnace to the pump. That is, air passes over and reacts with the residue to form volatile compounds which are exhausted from the furnace by the pump. The concentrations of the compounds are thus reduced to a harmless level in the furnace during the next deposition run, thereby reducing reactions with the deposition gases which would produce particulate contamination of the BPTEOS film.

Alternatively, in another embodiment, the load locked chamber 11 may be used when the furnace is opened to permit wafer movement into or out of the furnace. Load locked chambers are well known to those skilled in the art and need not be described in detail. The chamber is connected to a vacuum pump so that atmospheric water vapor never enters the furnace as wafers are moved into and out of the furnace.

Only the dielectric deposition portion of the integrated circuit manufacturing process is described for reasons of brevity and clarity. The other elements of the manufacturing process, as well as the circuits themselves, are well known to those skilled in the art and need not be described in detail. For example, those skilled in the art will readily perform the necessary lithographic patterning steps, doping processes, etc.

Variations in the method described will be readily apparent to those skilled in the art. For example, methods other than those described for reacting the condensates and removing the products and for reducing the unwanted backflow of the volatile compounds into the furnace will be apparent to those skilled in the art. A separate vacuum system could be used to remove the volatile compounds.

We claim:

1. A method of integrated circuit manufacture comprising the step of depositing a dielectric on wafers in a furnace by chemical vapor deposition, said dielectric comprising BPTEOS, comprising the further step of preventing the deposition of unwanted chemically generated particles on said dielectric in the deposition furnace, said preventing is by using a load locked chamber when wafers are loaded or unloaded from the furnace.

* * * * *